(12) United States Patent
Van de Ven

(10) Patent No.: US 9,642,208 B2
(45) Date of Patent: May 2, 2017

(54) VARIABLE CORRELATED COLOR TEMPERATURE LUMINARY CONSTRUCTS

(75) Inventor: Antony P. Van de Ven, Hong Kong (CN)

(73) Assignee: Cree, Inc., Durham, NC (US)

(*) Notice: Subject to any disclaimer, the term of this patent is extended or adjusted under 35 U.S.C. 154(b) by 1135 days.

(21) Appl. No.: 13/170,733

(22) Filed: Jun. 28, 2011

(65) Prior Publication Data
US 2013/0002167 A1 Jan. 3, 2013

(51) Int. Cl.
| H05B 37/02 | (2006.01) |
| H05B 33/08 | (2006.01) |
| F21K 9/64 | (2016.01) |
| F21V 9/16 | (2006.01) |
| H01L 25/075 | (2006.01) |
| H01L 33/50 | (2010.01) |
| F21Y 101/00 | (2016.01) |

(52) U.S. Cl.
CPC ........... *H05B 33/0869* (2013.01); *F21K 9/64* (2016.08); *H05B 33/0815* (2013.01); *H05B 33/0827* (2013.01); *F21V 9/16* (2013.01); *F21Y 2101/00* (2013.01); *H01L 25/0753* (2013.01); *H01L 33/50* (2013.01); *H01L 2924/0002* (2013.01)

(58) Field of Classification Search
CPC .................................. H05B 37/02; F21V 9/00
USPC .................................. 315/297, 294; 362/231
See application file for complete search history.

(56) References Cited

U.S. PATENT DOCUMENTS

| 8,058,816 B2 | 11/2011 | Sejorka |
| 2007/0170447 A1 | 7/2007 | Negley et al. |
| 2007/0258240 A1* | 11/2007 | Ducharme et al. ........... 362/231 |
| 2008/0043464 A1* | 2/2008 | Ashdown ...................... 362/231 |
| 2008/0048200 A1* | 2/2008 | Mueller et al. ................ 257/98 |
| 2009/0026913 A1* | 1/2009 | Mrakovich .................... 313/498 |
| 2009/0184616 A1 | 7/2009 | Van de Ven et al. |
| 2011/0001431 A1* | 1/2011 | Brukilacchio ................ 315/152 |
| 2011/0019399 A1 | 1/2011 | Van de Ven et al. |

* cited by examiner

*Primary Examiner* — Douglas W Owens
*Assistant Examiner* — Amy Yang
(74) *Attorney, Agent, or Firm* — Christopher J. Knors; Moore & Van Allen PLLC

(57) ABSTRACT

A lighting device comprising plural excitation sources configured to provide at least two excitation peak emissions of different wavelength and at least one phosphor material radiationally coupled to the plural light source, the lighting device having a plurality of operational states comprising a first operation state wherein excitation of the at least one phosphor material by a first peak emission from the plural excitation sources provides a first correlated color temperature (CCT) value, and at least one additional operational state wherein excitation of the at least one phosphor material by a second peak emission from the plural excitation sources provides at least one additional CCT value different from the first CCT value. Methods of varying the CCT value using the lighting device with controlled power distribution to the plural excitation sources.

48 Claims, 6 Drawing Sheets

VARIABLE CORRELATED COLOR TEMPERATURE LUMINARY CONSTRUCTS

TECHNICAL FIELD

The present disclosure relates generally to a solid state lighting device providing variable correlated color temperature (CCT) comprising different excitation sources and at least one phosphor.

BACKGROUND

Light emitting diodes (LED or LEDs) are solid state devices that convert electric energy to light, and generally comprise one or more active layers of semiconductor material sandwiched between oppositely doped layers. When a bias is applied across the doped layers, holes and electrons are injected into the active layer where they recombine to generate light. Light is emitted from the active layer and from all surfaces of the LED.

Color Rendering Index (CRI Ra) is a modified average of the relative measurements of how the color rendition of an illumination system compares to that of a reference radiator when illuminating eight reference colors, i.e., it is a relative measure of the shift in surface color of an object when lit by a particular lamp. The CRI Ra equals 100 if the color coordinates of a set of test colors being illuminated by the illumination system are the same as the coordinates of the same test colors being irradiated by the reference radiator. Daylight has a high CRI (Ra of approximately 100), with incandescent bulbs also being relatively close (Ra greater than 95), and fluorescent lighting being less accurate (typical Ra of 70-80). Certain types of specialized lighting have very low CRI (e.g., mercury vapor or sodium lamps have Ra as low as about 40 or even lower). Sodium lights are used, e.g., to light highways—driver response time, however, significantly decreases with lower CRI Ra values (for any given brightness, legibility decreases with lower CRI Ra). See Commission Internationale de l'Eclairage. Method of Measuring and Specifying Colour Rendering Properties of Light Sources, CIE 13.3 (1995) for further information on CRI.

Many methods are known for allowing a lighting device to be adjustable in color temperature, including using a variable combination of warm white and cool white light sources, using red, green and blue light sources. However, all these methods generally provide low to medium CRI Ra.

Several products available today provide luminaries having variable color temperature (variable CCT). The variation in CCT is typically provided by varying the light output level of different color LEDs, such as red, green and blue (RGB) or RGB and white (RGBW) solid state devices so that the combined light output appears to change color. This can provide accent lighting, e.g., changing lighting scenarios, light colors and control of the CCT of the lighting based on the time of day, the presence or absence of people, and the amount of natural light available.

Techniques have been developed for converting the light emitted from LEDs to colored light for illumination purposes. In one technique, an LED can be coated or covered with a phosphor layer having a phosphor material that absorbs radiation energy in one portion of the electromagnetic spectrum and emits energy in another portion of the electromagnetic spectrum. The color of the emission from the LED can be controlled by the selection of excitation source and phosphor. Various combinations of excitation sources and/or phosphor emissions are possible to provide light of a specific color, including white light.

The total of the light from the combination of the phosphor and the solid state light source provides a color point having a corresponding color coordinates (e.g. x and y on the 1931 CIE chromaticity diagram, or u' and v' on the 1976 CIE chromaticity diagram) and correlated color temperature (CCT) and a distance from the blackbody locus. However, a CCT is defined only in the vicinity of the blackbody (a.k.a. Planckian) locus. In luminaries of any targeted CCT, the color point preferably lies substantially on the Planckian locus, and the distance (in the form of a circle) from the blackbody locus value is preferably less than 0.010 du'v' from the point on the Planckian locus in the 1976 CIE chromaticity diagram (CIE76 diagram). The variation in CCT can also be described in terms of a MacAdam's ellipse, forming ellipse on both the CIE31 diagram (CIE31) and the 1976 CIE chromaticity diagram (CIE76 diagram). It is preferable that the color point for white light is within a 10 or 7 step macAdam's ellipse of the Black body locus.

Providing for and maintaining a single CCT in a specified range, notwithstanding a variable CCT, becomes increasingly difficult when using multiple phosphor blends, especially those using more than two phosphors. Therefore, making multi-phosphor-adjusted LED based lighting devices with variable CCT values remains elusive.

SUMMARY

The present disclosure provides for varying the level of plural excitation sources that excite a phosphor system, where at least one of the phosphors is differentially excited by the different excitation sources while the at least one of the phosphors are exposed to all of the excitation sources. The change in CCT can be along the black body locus, or, can be not entirely based on the selection of the phosphors.

Thus, in a first embodiment, a lighting device is provided. The device comprises plural excitation sources configured to provide at least two excitation peak emissions of different wavelength; and at least one phosphor materials radiationally coupled to the plural light source. The device has at least two operational states comprising: a first operation state wherein emission by the at least one phosphor material upon excitation by the plural excitation sources contributes to a first correlated color temperature (CCT) value for the lighting device, and at least one additional operational state wherein emission by the at least one phosphor material upon excitation by the plural excitation sources contributes to at least one additional CCT value for the lighting device, wherein the at least one additional CCT value is different from the first CCT value.

In a second embodiment, a lighting device is provided, the lighting device comprising: plural spaced-apart LEDs configured to provide at least two excitation peak emissions of different wavelength, electrical circuitry configured to selectively control electrical power distribution to the plural spaced-apart LEDs; and at least one phosphor material radiationally coupled to the plural spaced-apart LEDs. The lighting device has at least two operational states comprising: a first operation state wherein emission by the at least one phosphor material upon excitation by at least one of the at least two excitation peak emissions contributes to a first correlated color temperature (CCT) value for the lighting device, and at least one additional operational state wherein emission by the at least one phosphor material upon excitation by at least one of the at least two excitation peak emissions contributes to at least one additional CCT value for the lighting device, wherein the at least one additional CCT value is different from the first CCT value.

In a third embodiment, a method of varying the correlated color temperature (CCT) value of a lighting apparatus is provided. The method comprises the steps of providing a lighting device, the device comprising: a plural light source providing at least two peak emissions of different wavelengths; providing at least one phosphor material radiationally coupled to the plural excitation sources, and at least two operational states. The operational states comprise: (i) a first operation state wherein excitation of the at least one phosphor material by a first peak emission from the plural excitation sources provides a first correlated color temperature (CCT) value, and (ii) at least one additional operational state wherein excitation of the at least one phosphor material by a second peak emission from the plural excitation sources provides at least one additional CCT value, wherein the at least one additional CCT value is different from the first CCT value. The relative amount of the at least two peak emissions of different wavelengths are adjusted.

DETAILED DESCRIPTION

Figure 1:
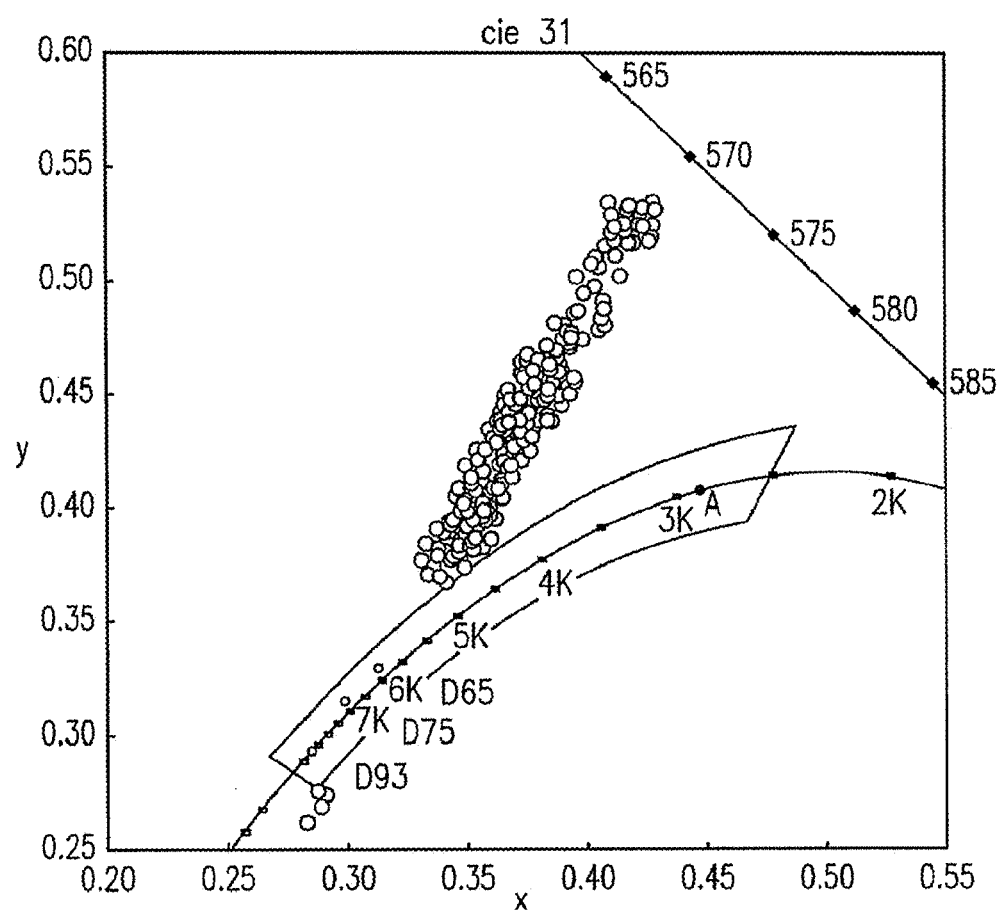
FIG. 1 is a CIE diagram illustrating the blackbody locus and a region of light.

A light emitting device is provided comprising a solid state lighting device comprising different excitation sources through a phosphor system where at least one of the phosphors is differentially excited by the different excitation sources and at least one phosphor material is exposed to all of the excitation sources.

In one aspect, a device comprising a plurality of excitation sources is arranged with a single phosphor material to directly or indirectly produce light and configured to change the CCT of the light. In one aspect, the device comprising a plurality of excitation sources is arranged with a single phosphor material to directly or indirectly produce white light, configured to change the CCT of the white light. The plural light source can comprise one or more LEDs and/or spaced apart LEDs.

In another aspect, a device comprising a plurality of excitation sources is arranged with a plurality of phosphor materials to directly or indirectly produce light and configured to change the CCT of the light. In one aspect, the device comprising a plurality of excitation sources is arranged with a plurality of phosphor materials to directly or indirectly produce white light configured to change the CCT of the white light. The phosphor materials can be combined in an optically transparent media, and/or spatially separated from the plural light source. Alternatively, the plural phosphor materials can be deposited on the plural light source, or the plural phosphor materials can be deposited on the plural light source and spatially separated from the plural light source.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. It will be understood that these terms are intended to encompass different orientations of the element in addition to any orientation depicted in the figures.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

The term "emission," as used herein when referring to a light source, means that at least some current is being supplied to the light source to cause the light source to emit at least some light. The expression "excitation peak emission" encompasses situations where the light source, e.g., a light emitting diode (LED) emits a relatively discrete band of light (e.g., a subset of the electromagnetic spectrum, such as UV, blue, red, etc.) continuously or intermittently at a rate such that a human eye would perceive it as emitting light continuously, or where a plurality of excitation sources producing the same color or different colors are emitting light intermittently and/or alternatingly (with or without overlap in "on" times) in such a way that a human eye would perceive them as emitting light continuously (and, in cases where different colors are emitted, as a mixture of those colors).

The term "illumination" (or "illuminated"), as used herein when referring to a light source, means that at least some current is being supplied to the light source to cause the light source to emit at least some light. The expression "illuminated" encompasses situations where the light source is a solid state light emitter or other luminary that emits light continuously or intermittently at a rate such that a human eye would perceive it as emitting light continuously, or where a plurality of solid state light emitters of the same color or different colors are emitting light intermittently and/or alternatingly (with or without overlap in "on" times) in such a way that a human eye would perceive them as emitting light continuously (and, in cases where different colors are emitted, as a mixture of those colors).

The phrase "phosphor materials" is used herein to refer to any material or composition of matter that absorb light at one wavelength and re-emits light at a different wavelength, regardless of the delay between absorption and re-emission, and regardless of the wavelengths involved. Accordingly, the phrase "phosphor material" encompasses "phosphors," "lumiphors," "wavelength converting materials," "luminescent materials," and "color shifting elements" and is used herein to encompass such materials that are fluorescent and/or phosphorescent and/or can be particles which absorb light having an absorbing wavelength(s) and re-emit light having longer or shorter wavelength(s) (can be categorized as being down-converting, i.e., a material which converts photons to a lower energy level (longer wavelength) or up-converting, i.e., a material which converts photons to a higher energy level (shorter wavelength)). Inclusion of phosphor materials in LED devices can be accomplished in a variety of ways, one representative way being by adding the phosphor materials to a clear or transparent encapsulant material (e.g., epoxy-based, silicone-based, glass-based or metal oxide-based material) as discussed herein, for example by a blending or a coating process.

The term "excited," as used herein when referring to a phosphor material, means that at least some electromagnetic radiation (e.g., visible light, UV light or infrared light) is contacting the phosphor material, causing the phosphor material to emit at least some light. The expression "excited" encompasses situations where the phosphor material emits light continuously or intermittently at a rate such that a human eye would perceive it as emitting light continuously, or where a plurality of phosphor materials of the same color or different colors are emitting light intermittently and/or alternatingly (with or without overlap in "on" times) in such a way that a human eye would perceive them as emitting light continuously (and, in cases where different colors are emitted, as a mixture of those colors). The term "excited" in this context, is synonymous with "energizing a phosphor," "exciting a phosphor," "excitation of . . . phosphor," "phosphor emission" or grammatical equivalents thereof.

The phrase "dominant emission wavelength", as used herein, means (1) in the case of an excitation source such as a solid state light emitter, the dominant wavelength of light that the solid state light emitter emits if it is illuminated, and (2) in the case of a phosphor material, the dominant emission wavelength of light that the phosphor material emits if it is excited.

The phrase "peak emission wavelength", as used herein, means (1) in the case of a solid state light emitter, the peak wavelength of light that the solid state light emitter emits if it is illuminated, and (2) in the case of a phosphor material, the peak wavelength of light that the phosphor material emits if it is excited. Peak emission wavelength can be the same or different from the dominant emission wavelength for either an excitation source or a phosphor material.

The phrase "correlated color temperature" is used according to its well-known meaning to refer to the temperature of a blackbody that is, in a well-defined sense (i.e., can be readily and precisely determined by those skilled in the art), nearest in color as defined by the CIE.

The phrase "phosphor layer," is used herein to refer to any layer(s) or similar structure comprising or consisting of one or more of a phosphor material (e.g., phosphor(s)). In one aspect, there can be provided a plurality of "phosphor layers," for example, each of the plurality represented individually by a laminate structure. A layer can be co-planar with another layer on a substrate, for example, two phosphor layers of different composition but similar (or different) thickness can be spatially arranged on a substrate as layers.

The term "light" refers generally to light as perceived by normal human vision and also includes electromagnetic radiation in portions of the UV regions and portions of the IR regions of the electromagnetic radiation spectrum. Unless otherwise noted, the term "light" is inclusive of electromagnetic radiation having a wavelength between 100 nm and 1000 nm.

The phrase "UV light" as used herein, with reference to excitation sources, encompasses the wavelengths of light generally recognized as "UV", for example, wavelengths of light shorter than visible light and longer than x-rays, produced by such excitation sources, preferably non-ionizing radiation. UV light with reference to excitation sources encompasses Near UV (NUV) (e.g., about 200 nm to about 400 nm), UVA, UVB, and UVC. Examples of Near UV excitation sources includes LED's having emission peaks of about 365 nm to about 395 nm.

As used herein, the expression "radiationally coupled" refers to a phosphor material being excited by an excitation source, e.g., an excitation source when the source is emitting light. For example, a red phosphor that is "radiationally coupled" to a UV light source would be excited upon receiving light emission from the UV source.

The phrase "spatial arrangement" as used herein, with reference to a phosphor material, encompasses complete or partial physical isolation of a volume of the material, as well as gradients of the material in one or more dimensions (length, width, height). Thus, the phrase "spatial arrangement" includes wavelength conversion materials, layers and carriers (and diffusers) being remote to one another. Remote in this context refers to being spaced apart from and/or to not being on or in direct thermal contact. For example, using lithographic techniques, a spatial arrangement of the phosphor material can be provided on a substrate, whereas isolated volumes of one or more phosphor material exist. For example, a predetermined pattern can be provided with areas/volumes substantially devoid of the material adjacent to areas/volumes comprising the material. Two isolated volumes can partially overlap in the substrate, so long as the adjacent regions measurably differ in their effect on impinging light. In another example, a random mixture of phosphor materials can be dispersed or distributed in a form or film material and discrete section of the form or film material can be photo-bleached, photo-etched (e.g. with intense laser light specific for one or more (or all) of either the form, film material, or the phosphor materials), or micro-machined so as to provide a spatial arrangement of phosphor materials as described above.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the present disclosure will now be described more fully hereinafter with reference to the accompanying drawings, in which embodiments of the invention are shown. This disclosure may, however, be embodied in many different forms and should not be construed as limited to the embodiments set forth herein. Rather, these embodiments are provided so that this disclosure will be thorough and complete, and will fully convey the scope of the claims to those skilled in the art. Like numbers refer to like elements throughout.

In some embodiments according to the present inventive subject matter, the excitation source comprises at least one phosphor-LED arrangement. Phosphor-LEDs are made by coating, or surrounding, or having in proximity to (e.g., remotely) plural LEDs (e.g., which collectively emits at least two peak wavelengths of light, for example, blue and/or violet-blue and/or violet light), plural phosphor materials wherein at least one of the phosphors is differentially excited by the two peak wavelengths, the phosphor subsequently emitting at least one corresponding peak wavelength. The corresponding at least one peak wavelength emitted by the phosphor upon excitation by the plural excitation sources can vary in intensity and/or wavelength depending on the excitation source that causes the phosphor to excite. Often, the phosphor material is chosen to emit yellow light, as a combination of blue and yellow light can make white light. A phosphor often used is YAG:Ce. The light emitted by the phosphor material can be combined with all or a portion of the blue light emitted by, e.g., a light-emitting-diode, and the combined light has a hue and purity different from either the light-emitting-diode or the phosphor.

Figure 2:
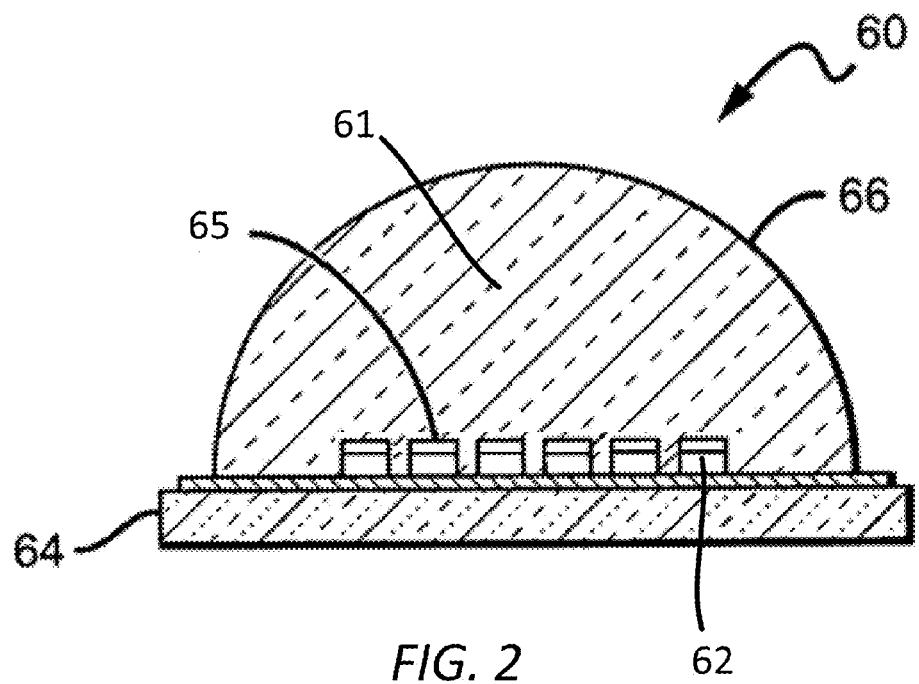
FIG. 2 is a sectional view representing an embodiment of the present disclosure.

FIG. 2 shows a monolithic LED package 60 comprising plural LED chips 62 mounted on the surface of a submount 64 with conventional optical media 66 having a globe-like shape about the perimeter of submount 64. At least some of the LED chips 62 are interconnected in a series circuit. The LED chips 62 are shown coated with one or more phosphors 65. The internal volume 61 of the optical media 66 can be air and/or a substance having an appropriate difference in the refraction index as compared to the optical media 66. Phosphors present in or on the optical media 66 typically emit light evenly in all directions from any or all points about the globe shape. The light leaving the globe and observed by an observer can be essentially all of the light emitted by the phosphor or a portion of that light. The LED chips 62 are preferably mounted on a substantially planar surface of the submount 64 and are arranged under a single globed optical element. In other embodiments, the LED chips can be mounted on a non-planar substrate or submount. In the embodiments shown above, the component 60a can be configured to emit white light at a desired color point and color rendering index as a combination of light from the various LEDs. Use of the globed optical element in these configurations allows for tuning the color of light for the LED package. It is understood that LED components according to the present disclosure can be fabricated using a method that incorporates submount panel or wafer comprising a plurality of submounts. Each of the submounts 64 can be formed with its own array of LEDs and globed optical elements such that multiple LED chips 62 can be formed across the submount panel. Multiple LED chips 62 can then be singulated from the submount panel. Each submount 64 may also comprise a more complex combination of elements such as a plurality of "submount" assemblies which are mounted on a planar surface of submount. The submount assemblies can have different functionalities such as providing electrostatic discharge (ESD) protection for the various LED chips. The size of the submount 64 in LED package 60 can vary depending on certain factors such as the size and number of LEDs. It is understood that the submount 64 can have essentially any shape, such as circular, oval, rectangular, hexagonal, or other multiple sided shapes. In another embodiment, single LED element luminary packages can also be provided. The LED device can be configured as a flip chip LED package.

It is understood that the LED chips in the arrays as herein disclosed and described can be arranged as one or more multiple multi-chip LED lamps as described in U.S. Patent Publication No. 2007/0223219 entitled "Multi-Chip Light Emitting Device for Providing High-CRI Warm White Light and Light Fixtures Including the Same," the disclosure of which is incorporated by reference.

Figure 3:
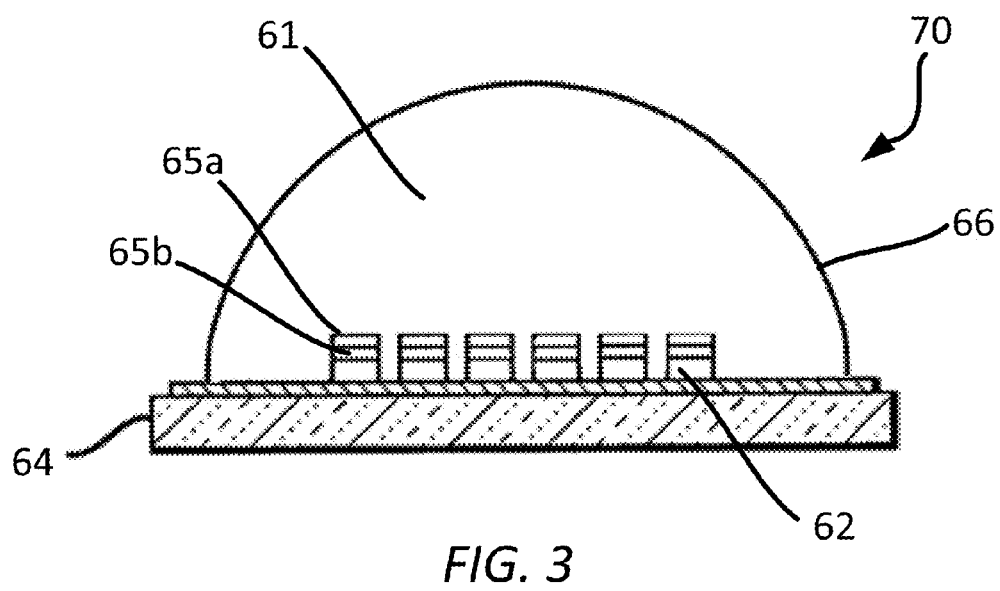
FIG. 3 is a sectional view representing an alternate embodiment of the present disclosure.

FIG. 3 provides for an exemplary arrangement of a phosphor-LED device in accordance with various embodiments of the present disclosure. Thus, monolithic LED package 70 comprising plural LED chips 62 mounted on the surface of a submount 64 with conventional optical media 66 having a globe-like shape about the perimeter of submount 64. At least some of the LED chips 62 are interconnected in a series circuit. The LED chips 62 are shown coated with plural layers of phosphors 65a, 65b.

Figure 4:
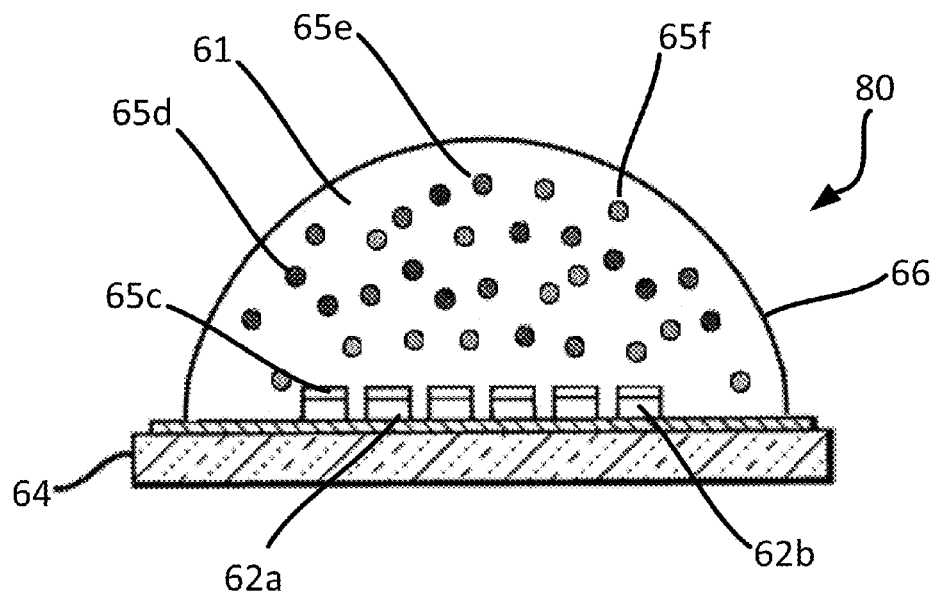
FIG. 4 is a sectional view representing an alternate embodiment of the present disclosure.

FIG. 4 provides for an exemplary arrangement of phosphors-LEDs in accordance with various embodiments of the present disclosure. Thus, monolithic LED package 80 comprising plural LED chips 62a, 62b mounted on the surface of a submount 64 with conventional optical media 66 having a globe-like shape about the perimeter of submount 64. At least some of the LED chips 62a, 62b are interconnected in a series circuit. The LED chips 62a, 62b are shown coated with phosphor 65c with additional phosphors 65d-f within the internal volume 61 of the optical media 66.

Figure 5:
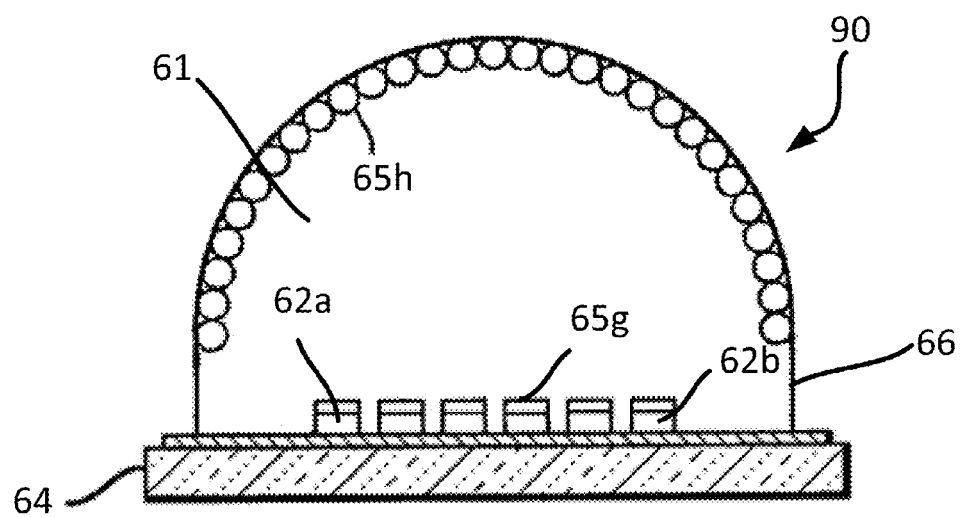
FIG. 5 is a sectional view representing an alternate embodiment of the present disclosure.

FIG. 5 provides another exemplary arrangement of phosphors-LEDs in accordance with various embodiments of the present disclosure. Thus, monolithic LED package 70 comprising plural LED chips 62 mounted on the surface of a submount 64 with conventional optical media 66 having a globe-like shape about the perimeter of submount 64. At least some of the LED chips 62 are interconnected in a series circuit. The LED chips 62a, 62b are shown coated with phosphor 65g with additional phosphor layer 65h coated on the inner surface the optical media 66.

In one exemplary embodiment according to the present disclosure, in a first operational state the LED chips 62 are configured to provide a lighting device providing a predetermined light, e.g., cool white or warm white (or other color). For example, LEDs chips 62 can have an LED that emits light in the blue wavelength spectrum and the phosphor absorbs some of the blue light and re-emits yellow, with the combination of LED chips 62 and phosphor contributing so that the lighting device emits a white light combination of blue and yellow light. In one embodiment, the phosphor comprises commercially available YAG:Ce, although a full range of broad yellow spectral emission is possible using conversion particles made of phosphors based on the $(Gd,Y)_3(Al,Ga)_5O_{12}$:Ce system, such as the $Y_3Al_5O_{12}$:Ce (YAG). Other yellow phosphors that can be used for white emitting LED chips include, for example: $Tb_{3-x}RE_xO_{12}$:Ce(TAG); RE=Y, Gd, La, Lu; or $Sr_{2-x-y}Ba_x$-$Ca_ySiO_4$:Eu.

In at least one other operational state, the plural excitation sources (e.g., LED chips) can be configured for receiving a power distribution (e.g., current) such that, for example, UV-light LEDs are turned off or dimmed, whereas blue-light LED are kept at or near the first operational condition. In this configuration, the LED chips can comprise plural phosphor materials at least one of which differentially absorbs the LED light from the plural LEDs and emits light proportional to that difference. Some phosphors appropriate for these structures can comprise, for example: Red $Lu_2O_3$:$Eu^{3+}$ $(Sr_{2-x}La_x)(Ce_{1-x}Eu_x)O_4$ $Sr_2Ce_{1-x}Eu_xO_4$ $Sr_{2-x}Eu_xCeO_4$ $SrTiO_3$:$Pr^{3+}$,$Ga^{3+}$ $CaAlSiN_3$:$Eu^{2+}$ $Sr_2Si_5N_8$:$Eu^{2+}$ as well as SrxCa1-xS:Eu, Y; Y=halide; CaSiAlN3:Eu; and/or Sr2-yCaySiO4:Eu. Other phosphors can be used to create color emission by converting substantially all light to a particular color. For example, the following phosphors can be used to generate green light: $SrGa_2S_4$:Eu; $Sr_{2-y}Ba_ySiO_4$:Eu; or $SrSi_2O_2N_2$:Eu. The following lists some additional suitable phosphors, for example as particles in one or more layers, although others can be used. One or more of these phosphors exhibits excitation by blue and/or UV LEDs, provides a desirable differential peak emission, has efficient light conversion, and has acceptable Stokes shift:

| YELLOW/GREEN | RED |
|---|---|
| (Sr, Ca, Ba)(Al, Ga)$_2$S$_4$: Eu$^{2+}$ | Lu$_2$O$_3$: Eu$^{3+}$ |
| Ba$_2$(Mg, Zn)Si$_2$O$_7$: Eu$^{2+}$ | (Sr$_{2-x}$La$_x$)(Ce$_{1-x}$Eu$_x$)O$_4$ |
| Gd$_{0.46}$Sr$_{0.31}$Al$_{1.23}$O$_x$F$_{1.38}$: Eu$^{2+}$$_{0.06}$ | Sr$_2$Ce$_{1-x}$Eu$_x$O$_4$ |
| (Ba$_{1-x-y}$Sr$_x$Ca$_y$)SiO$_4$: Eu | Sr$_{2-x}$Eu$_x$CeO$_4$ |
| Ba$_2$SiO$_4$: Eu$^{2+}$ | SrTiO$_3$: Pr$^{3+}$, Ga$^{3+}$ |
| Lu$_3$Al$_5$O$_{12}$ doped with Ce$^{3+}$ | CaAlSiN$_3$: Eu$^{2+}$ |
| (Ca, Sr, Ba)Si$_2$O$_2$N$_2$ doped with Eu$^{2+}$ | Sr$_2$Si$_5$N$_8$: Eu$^{2+}$ |
| CaSc$_2$O$_4$: Ce$^{3+}$ | |
| (Sr, Ba)$_2$SiO$_4$: Eu$^{2+}$ | |

Other structures, arrangements, and combinations of single and/or multi-color LED-phosphor chips can be employed to provide a desired variable CCT effect, as emotional lighting for physiological treatment or for displaying objects.

As an example, one phosphor or a plurality of different phosphor materials can be chosen and/or their composition, concentration, thickness, and/or spatially arrangement predetermined about or on the LED elements or on or within a globe-like optical media/element remotely positioned from the LED elements. In this manner, the globe with remotely positioned phosphor so arranged, can more uniformly and reproducibly convert the LED light into a collection of phosphor-emitted light of different wavelengths, contributing the total light of the lighting device, determined by the power distribution to the particular LED elements exciting the phosphors. Thus, for example, when using a power distribution exciting one or more blue LEDs, the phosphor may be a YAG:Ce phosphor, and may optionally include additional red-, green- orange-LED elements and/or phosphors for a desired light characteristic, such as blends containing red-emitting phosphors for increased color warmth. Other suitable phosphors may be used depending on the peak excitation wavelength range emitted from the particular LEDs and the particular color, CRI or CCT value desired.

Still other embodiments can comprise different LED chips with plural LEDs emitting at different wavelengths exciting the at least one phosphor. For example, in any of the LED chip configurations above in which at least one of the emitters comprises a short wavelength emitter radiationally coupled to one or more phosphor emitters. An ultraviolet emitting LED can be used as the LED. Likewise, in the same lighting device, a blue light emitting LED radiationally coupled to the one or more phosphor emitters that are also radiationally coupled to the ultraviolet LED can be arranged. The blue and UV LEDs can independently receive separate power distribution. For example, an optical material that forms or is contained in the globe preferably is substantially transparent in the UV region associated with the ultraviolet emitting LED (e.g., polydimethylsiloxane, polyurethanes, poly(meth)acrylates, polynorbornenes, and derivatives, etc.) can comprise such phosphors. This provides, in one example, a predominant emission component of the LED chips in the first operational state coming from the phosphor excited by the ultraviolet LED, and the predominant emission component of the LED chips in the second operational state coming from the phosphor excited by the blue LED with or without additional LED elements contributing to the CCT.

Thus, in one example, the at least one phosphor material can comprise one or more of a red phosphor, a green phosphor, and a yellow phosphor. The lighting device can comprise a first operation state where emission of at least one of the red phosphor, the green phosphor, and the yellow phosphor is caused by a UV light excitation source, and where in the at least one additional operational state, emission of the at least one of the red phosphor, the green phosphor, and the yellow phosphor is excited by a blue light excitation source. A power supply arrangement that alters the power distribution to the UV and/or blue excitation sources can be employed to provide variability of the CCT of the lighting device.

By way of example, each of the following phosphors exhibits excitation in the UV emission spectrum, provides a desirable peak emission, has efficient light conversion, and has acceptable Stokes shift, for example: Yellow/Green: $(Sr,Ca,Ba)(Al,Ga)_2S_4$:$Eu^{2+}$ $Ba_2(Mg,Zn)Si_2O_7$:$Eu^{2+}$ $Gd_{0.46}Sr_{0.31}Al_{1.23}O_xF_{1.38}$:$Eu^{2+}_{0.06}$ $(Ba_{1-x-y}Sr_xCa_y)SiO_4$:Eu $Ba_2SiO_4$:$Eu^{2+}$.

The phosphors can be spatially arranged on or about the plural LEDs and/or on the globe or in the optical media encompassed by the globe. The phosphors can be comprised of a plurality of layers of varying thickness and/or composition and/or concentration. Thickness of the phosphor layers can vary in the entirety of the layer, or in discrete sections of the layer, and/or be gradient. Thickness of the phosphors and phosphor concentration and composition can be achieved using conventional printing and/or photolithographic techniques and/or in combination with spray coating deposition/masking/developing/etching or polishing techniques known in the art. Directly coating the phosphor material to a predetermined thickness will provide a concentration commensurate with the thickness coated. One or more films with the phosphor material in or on can be used to provide a predetermined thickness, concentration, and/or composition. The one or more films can have different thicknesses depending at least partially on the predetermined concentration of phosphor material and the desired amount of light to be converted by the plurality of layers. A typical predetermined concentration of phosphor material includes a range of 30-70% by weight, such as in one or more film layers. In one embodiment, the phosphor material concentration is approximately 65% by weight. A plurality of layers according to one aspect of the present disclosure can be applied with concentration levels (phosphor loading) above 30% by weight. Other embodiments can have concentration levels above 50% by weight, while in still others the concentration level can be above 60% by weight. In one embodiment, the phosphor material has different predetermined regions (spatial arrangements) with different, predetermined compositions of phosphor material and/or different predetermined concentrations of phosphor material.

In some embodiments, the phosphor layer can have thicknesses in the range of 10-100 microns, while in other embodiments it can have thicknesses in the range of 40-50 microns. In certain aspects, the methods presently disclosed provide for controlled thickness of the phosphor(s) where the phosphor is deposited on the film (as opposed to being mixed in the film material) around a predetermined thickness, e.g., 30-40 um, with a control of thickness variation (pre- or post-deposition) of +/−10%, 5%, or 1%. The predetermined thickness targeted by the concentration and/or composition of the phosphor (and any binding material), the intensity of the light that illuminates the area on the structure and the optical characteristics of any binder and/or other dispersants present in the coating or the substrate. A typical distance between the LED element and the furthest remote point on the globe can be between 0.1 mm and 80 mm, or longer.

Various methods can be used to apply multiple layers of the same or different phosphor materials and different phosphor materials can be applied in different areas of or on the globe using known techniques, such as masking processes. Other embodiments can comprise uniform and/or non-uniform distribution of phosphors in a film material, such as with different phosphor layer thicknesses and/or different phosphor material concentrations spatially arranged in the film material disposed on the LEDs or shaped in a globe or other shape about the LEDs. There can be multiple areas of different types of phosphors that can emit the same or different colors of light and/or have differential excitation from different LED elements, such as by having distinct regions of different phosphors in the film material.

Different sized phosphor materials, in the form of particles can be used including but not limited to particles in the range of 10 nanometers (nm) to 30 micrometers ($\mu$m), or larger. Smaller particle sizes typically scatter and mix colors better than larger sized particles to provide a more uniform light. Larger particles are typically more efficient at converting light compared to smaller particles, but emit a less uniform light. In some embodiments, one or more phosphor materials can be provided in as a layer in a binder, and the phosphor materials can also have different predetermined concentrations or loading of phosphor materials in the binder.

Suitable binder materials for the phosphor materials include silicones, epoxies, glass, inorganic glass, dielectrics, BCB, polymides, polymers and hybrids thereof, with the preferred material being silicone because of its high transparency and reliability in high power LEDs. Suitable phenyl- and methyl-based silicones are commercially available from Dow® Chemical. The binder can be cured using many different curing methods depending on different factors such as the type of binder used. Different curing methods include but are not limited to heat, ultraviolet (UV), infrared (IR) or air curing.

The phosphor materials can be applied on the LEDs and/or optical media and/or globe using different processes including but not limited to spin coating, sputtering, printing, powder coating, electrophoretic deposition (EPD), electrostatic deposition, among others. The phosphor materials can be applied along with a binder material, but it is understood that a binder is not required. In still other embodiments, phosphor materials in the form of one or more layers can be separately fabricated and then mounted to a carrier.

In one embodiment, a phosphor material-binder mixture can be sprayed or dispersed over a suitable globe or optical media with the binder then being cured to form the phosphor materials layer.

In any of the above manufacturing embodiments, an encapsulating material (not shown) may be provided over the diode(s), e.g. silicon, polyacrylates, etc, as refractive intermediary between the relatively high-index semiconductor and air and/or as diffusing lens, to enhance out coupling of the primary light from the diode(s).

In combination with the above aspects, the one or more additional phosphor material(s) can be coated on the outer side of the globe, i.e. at the side facing away from the LED element(s), forming a layer or shell over the globe. Thus, a separate layer can be attached to the globe.

In one aspect, the different excitation sources are UV and blue light, for example, from LEDs. By varying ratio of the excitation wavelengths, e.g., of blue light to UV light, that one or more of the plural phosphor is exposed to, the CCT of the system is varied. By way of example, if a red phosphor is more readily excited by a UV source than by a blue source, the CCT of the light from a system that has a yellow phosphor and a red phosphor may be changed by changing the amount of UV light excitation of the phosphors. Different combinations of excitation sources and phosphors can be used to provide the desired change of CCT (and/or CRI) for the lighting device. The resulting change in CCT may be along the black body locus and, in certain aspects, can be based partially on the selection of the phosphors.

Correlated color temperature variations from one operational state to another operational state of the present devices can be configured to provide a delta in CCT so as to allow adjustment of the color temperature to illuminate different surfaces and/or accent specific colors. Such adjustment includes emotional (or "mood") lighting effects that provide changing colors based on environmental conditions and/or time of day. In one aspect, a CCT value in one operational state is different from the CCT value in another operational state by at least 50K, preferably more than 500K, more than about 1000K, more than 2500K, more than 5000K, or more than 7500K.

In one aspect, the present lighting device includes filters to reduce or eliminate IR- and UV-light emanating from the device to avoid or prevent damage to delicate exhibits and/or surfaces. Such filters can be provided on or in the dome or encapsulating material or can be configured external to the device. UV filters can include L37 and/or L39 filters or the materials comprising the L37 and/or L39 filters, whereas an L37 filter effectively removes stray ultraviolet light with a wavelength shorter than 370 nm, whereas an L39 filter eliminates stray light with a wavelength shorter than 390 nm, while both filters are transparent to visible light. IR filters can include materials and coatings that are transparent to visible wavelengths and block essentially all of the infra red region of the electromagnetic spectrum. Combinations of UV/IR filters can be used, as well as visible "band pass" filters. Phosphor materials can be included in or on the UV/IR filters.

In an exemplary embodiment, a lighting device comprises plural excitation sources, e.g., AlGaN and/or AlGaInN ultraviolet LED chips, radiationally coupled to YAG-based or TAG-based yellow phosphor and separately powered group III nitride-based blue LED chips, such as GaN-based blue LED chips. The blue LEDs are radiationally coupled to the YAG-based or TAG-based yellow phosphor. In this case, the phosphor is excited by both UV and blue light emitted from the ultraviolet/blue LED chips. Yellow light together with stray blue light can be mixed together providing a first CCT. The CCT of the lighting device can be varied by adjusting the current to the ultraviolet LEDs thereby altering the relative UV light intensity to the phosphors to provide a second CCT. Thus, separate and discrete phosphor-LED structures can be avoided.

As another example, the plural light source can comprise LEDs of group III-nitride-based blue LED chips and group-III nitride-based ultraviolet LED chips with a combination or mixture of red, green and orange phosphor as plural phosphor material or layer. In this case, the multi-phosphor material is excited by both UV and blue light emitted from the ultraviolet/blue LED chips and then the mixture of red, green, an orange light together with stray blue light can be mixed together providing a first CCT value. The CCT value of the lighting device can be varied by adjusting the current to the ultraviolet LEDs thereby altering the relative UV light intensity to the phosphors to provide an additional CCT value different from the first CCT value.

In one aspect, the combination of plural LED peak emission wavelengths and plural phosphors, one of which is differentially excited by at least one of the different peak emissions, provides a white light of a first CCT value, which can be varied along the black body locus to provide an additional CCT value, as described above, is provided independently so that a "variable white light" is provided by the lighting device. In this aspect, it may be desirable that the difference (delta) between the first CCT value and the additional CCT value be equal to or greater than about 50 K or more, up to 8,000 K or more, in order to efficiently vary the CCT value of the finally emitted white light by controlling the current of the plural excitation sources. In one aspect, the difference between the first CCT value and the additional CCT value is equal to or greater than about 800 K to about 1,500K, preferably, about 1,000K.

Although, in the above-described embodiment, LED chips are connected in parallel to each other, the present disclosure is not limited thereto. For example, plural each light source can use LED chips connected in series to each other, three or more LED chips connected in parallel or series to one another, or a single LED chip. Furthermore, the above methods provide for the adjustment of the color sensation or color rendering index (CRI) of the device's emitted light.

In some embodiments, one group of LEDs is arranged in two strings with the other group of LEDs arranged in a single string between the two strings. In some embodiments, LEDs in one group are at least partially surrounded with a globe comprising at least one radiationally coupled phosphor material that is differently excited by the at least two peak excitation wavelengths from the excitation sources.

In still other embodiments according to the present disclosure, the LED component can comprise a plurality of series connection circuits comprising LED chips that emit light directly from their active region, with at least one series circuit provided for red, green, blue, and UV emitting LEDs, respectively. In other embodiments, series connected LEDs circuits can also be added emitting cyan, yellow and/or amber. Thus, the lighting device can preferably emit a combination of light from the series circuits that provides a tunable color rendering index (CRI).

In various embodiment according to the instant disclosure, the lighting device can comprise a single or plurality of series-connection LED circuits, comprising first and additional LEDs radiationally coupled to at least one phosphor material that is differently excited by the corresponding LED peak excitation wavelengths that can cover different spectral ranges, such as white, blue, green, yellow and red spectral ranges. The mixed emission can be cool or warm light with a color point on the black body locus or within an 8-step Mac Adam ellipse thereof with high color rendering index of greater than 50, greater than 80, greater than 85, and greater than 90.

Figure 6:
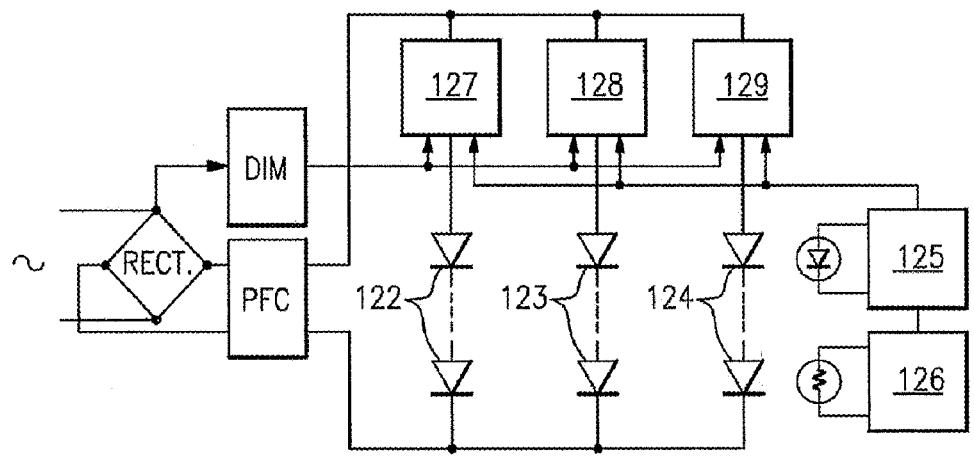
FIG. 6 is a schematic diagram of a linear arrangement of LEDs incorporating some embodiments of the present inventive disclosure.

FIG. 6 is a schematic block diagram of an electrical and control circuit of such an embodiment of a lighting device according to the present disclosure, providing by way of example, power distribution control of the phosphor-LEDs. In the circuit illustrated in FIG. 6, the phosphor LEDs 122, 123, 124 are configured to control the combined color or CCT produced by the LEDs. While the individual strings of LEDs (the expression "string", as used herein, means that at least two excitation sources are electrically connected in series) illustrated in FIG. 6 may be separately controlled, they may also be dependently controlled. Thus, for example, the initial color temperature of the lighting device may be established at the time of manufacture as described in co-assigned U.S. Published Patent Application No. 2009/0160363, filed on Oct. 24, 2008, the entirety of which is hereby incorporated by reference. The circuit also includes a rectifier ("RECT"), a dimmer ("DIM") and a power factor controller ("PFC").

As is further illustrated in FIG. 6, the CCT value may be controlled by, for example, the light sensor 125 and/or the temperature sensor 126 providing information to the regulated power supply units 127, 128 and 129 corresponding to the above LEDs so as to adjust the current/voltage applied to the LEDs (e.g., the LED power supply unit (PSU) 127 adjusts the current/voltage supplied to the phosphor LEDs 122, the LED PSU 128 adjusts the current/voltage supplied to the LEDs 123 and the LED PSU 129 adjusts the current/voltage supplied to the LEDs 124), to maintain, change, adjust, or otherwise control a color point of the lighting device. Such sensing may compensate for variations in aging of the differing LEDs and/or variation in temperature response of the differing LEDs, detect the presence/absence of motion, change in humidity, change in time-of-day, change in daylight, sound, etc. Suitable sensing techniques are known to those of skill in the art, some of which are described in co-assigned U.S. Published Patent Application No. 2008/0309255, filed on May 8, 2008 the entirety of which is hereby incorporated by reference.

Figure 7:
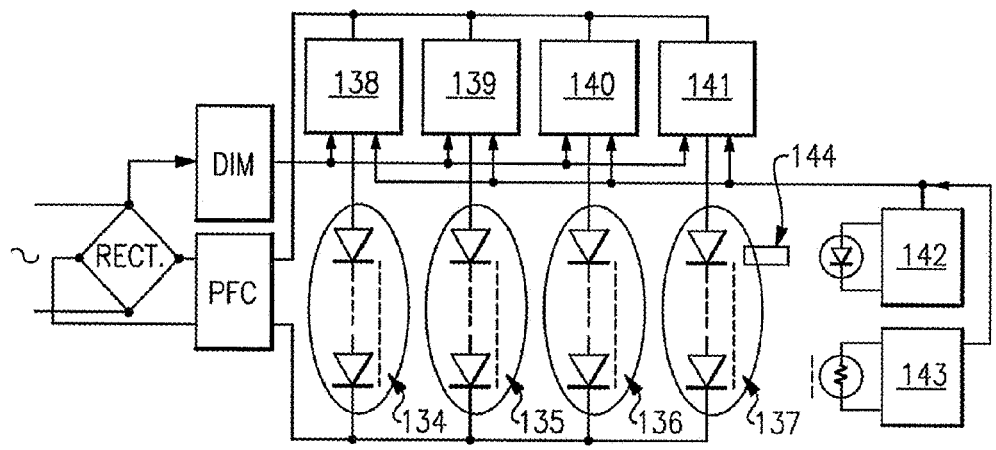
FIG. 7 is a schematic diagram of a linear arrangement of LEDs incorporating some embodiments of the present inventive disclosure.

FIG. 7 is a schematic block diagram of the circuit of another embodiment of a lighting device according to the present disclosure, similar to the embodiment shown in FIG. 7, but incorporating specific types of phosphor LEDs (namely, more UV phosphor LEDs 134 and more blueish phosphor LEDs 135), along with red/orange LEDs 136 and blue/cyan/green LEDs 137, which makes it possible to adjust the first and additional CCT values while maintaining high CRI. Each string of LEDs 134-137 has a corresponding PSU 138-141. Such an embodiment may be particularly well suited for use with the manufacturing methods discussed above with respect to the above mentioned U.S. Published Patent Application Ser. No. 2009/0160363, filed on Oct. 24, 2008. The embodiment shown in FIG. 7 also includes a light sensor 142 and a temperature sensor 143. Optionally, the embodiment shown in FIG. 7 can include an optical fiber or guide 144 for getting light from the LEDs to the light sensor 136.

Figure 8:
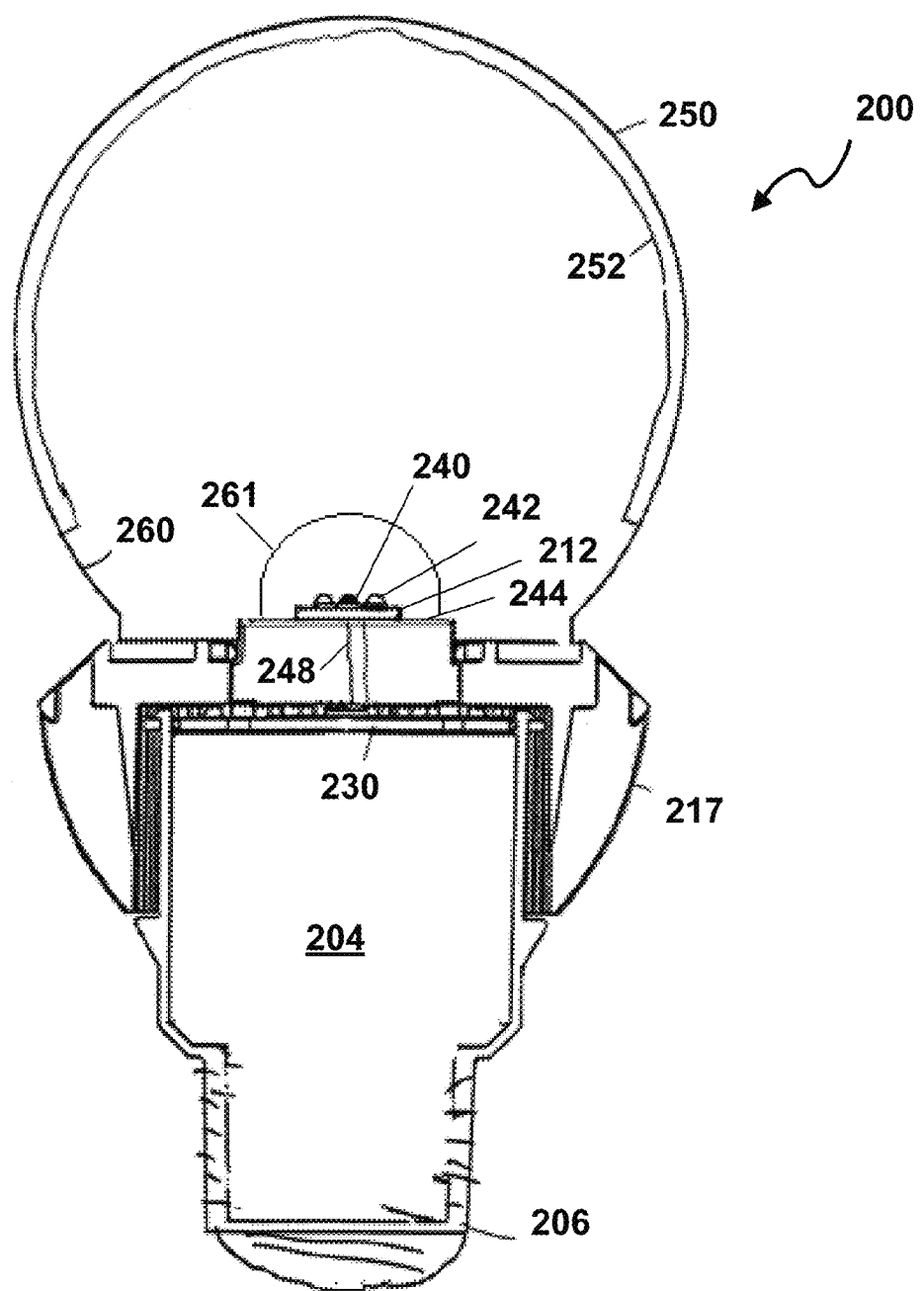
FIG. 8 is a partial sectional view of a lamp according to an embodiment of the present disclosure.

In another embodiment, FIG. 8 shows a side view of lamp, 200, including optical element 261, comprising or encapsulating at least one phosphor material. Lamp 200 can be omnidirectional or uni-directional. FIG. 8 is shown in as a partial cross section. In the case of FIG. 8, an LED assembly having modules 240 and 242 has been interconnected with power supply portion 204 of the lamp. The power supply portion 204 of the lamp includes a power supply consisting of circuitry to provide direct current to the LED assembly. By way of example, the particular power supply portion of an LED lamp shown in FIG. 8 includes an Edison base, 206. The Edison base can engage with an Edison socket so that this example LED lamp 200 can replace a standard incandescent bulb. The electrical terminals of the Edison base are connected to the power supply to provide AC power to the power supply. LED assembly can include multiple LED modules mounted on a carrier such as circuit board 212 or other substrate/submount, which provides both mechanical support and electrical connections for the LEDs. Heat sink 217 and thermal isolation device 230 are provided. The heat sink design can vary, for example, the heat sink may have more extended curved fins, more or fewer fins, etc. A heat sink may be provided that has a more decorative appearance.

Referring again to FIG. 8, LED assembly can comprise, for example, nine LED packages or LED modules, in which an LED chip is encapsulated inside a package with a lens (and/or diffuser) and leads. Each LED module is mounted in circuit board 212 configured to permit control electrical power distribution to individual LEDs and/or modules, for example via a dimmer switch operable by a user. In one aspect, plural LED modules include LEDs operable to emit light of two different wavelengths with the controllable power distribution. In this example embodiment, the LED modules on the LED assembly in the lamp of FIG. 15 include a group of LEDs, wherein, for example, each LED in module 240, when the module is energized, emits light having a first dominant emission wavelength. The LED assembly in the lamp of FIG. 15 includes another group of LEDs, wherein each LED in module 242, when the LED is illuminated, emits light having a second dominant emission wavelength. LED modules 240, 242 (and/or optical element 261 or coating 252) have at least one phosphor layer radiationally coupled to the LEDs of the modules. In this example, the electric power distribution to the LED modules 240, 242 can be controlled to vary the amount of peak excitation wavelengths from the LEDs of the modules that is radiationally coupled to the at least one phosphor layer, for example, using a wall mounted dimmer switch (not shown).

In one embodiment, the LED assembly of lamp 200 includes LED packages emitting UV- and blue-shifted light. In some embodiments, the LED assembly of the LED lamp 200 includes an LED array with at least two groups of LEDs, wherein one group, if illuminated, would emit light having a first peak excitation wavelength from about 250 nm to about 390 nm, and another group, if illuminated, would emit light having a second peak excitation wavelength from about from about 400 nm to up to 600 nm. The first and additional LEDs are radiationally coupled to at least one phosphor material that is differently excited by the corresponding LED peak excitation wavelengths and causing the at least one phosphor emission to change corresponding to the peak excitation wavelengths so as to vary the CCT value of the lighting device. Thus, for example, in the first operational state, both of the peak excitation wavelengths from the UV- and blue-LEDs are radiationally coupled to the at least one phosphor that is differently excited by the two peak excitation wavelengths providing a first correlated color temperature (CCT) for the lighting device, and in another operational state, the power to the UV LEDs are reduced or ceased causing the ratio of peak excitation wavelengths to be altered resulting in a change in the at least one phosphor emission providing a second CCT value for the lighting device. Other combinations of LEDs and phosphors can be used to provide for a predetermined first CCT values and additional predetermined CCT values. In some embodiments, the LED lamp 200 has a first operational state providing a first correlated color temperature (CCT) and at least one additional operational state providing for a CCT value different from the first CCT value by at least 50K, preferably more than 500K, more than about 1000K, more than 2500K, more than 5000K, or more than 7500K.

The LED assembly can be fastened to the support with adhesive, or any of various fastening mechanisms. Support 244 is installed on the pedestal in this example, disposed between LED assembly 202 and the power supply. Support 244 in this example embodiment is a thin reflective surface, which serves to enhance the light output and light distribution of lamp 200, but can be conical. The surface of the reflective surface can be adjusted by setting the angle through altering the height and size and shape of the LED assembly or the base, and by surface treatment to adjust the reflectivity of the outer surface. Wires 248 pass through a void inside the reflective surface of lamp 200 and interconnect LED modules 240 and 242 with the power supply.

The submount of the lighting device can be formed of many different materials with a preferred material being electrically insulating, such as a dielectric element, with the submount being between the LED array and the component backside. The submount can comprise a ceramic such as alumina, aluminum nitride, silicon carbide, or a polymeric material such as polyimide and polyester, etc. In the preferred embodiment, the dielectric material has a high thermal conductivity such as with aluminum nitride and silicon carbide.

When light from a light source is absorbed by the phosphor material, it is re-emitted in isotropic directions with approximately 50% of the light emitting forward and 50% emitting backward towards the LED. In prior LEDs having conformal phosphor layers, a significant portion of the light emitted backwards can be directed back into the LED and its likelihood of escaping is limited by the extraction efficiency of the LED structure. For some LEDs the extraction efficiency can be approximately 70%, so a percentage of the light directed from the conversion material back into the LED can be lost. In other aspects of the above embodiments, the submount 64 can also comprise additional highly reflective material, such as reflective ceramic or metal layers like silver, to enhance light extraction from the component.

In other embodiments the submount 64 can comprise a printed circuit board (PCB), alumina, sapphire or silicon or any other suitable material, such as T-Clad thermal clad insulated substrate material, available from The Bergquist Company of Chanhassen, Minn. For PCB embodiments, different PCB types can be used such as standard FR-4 PCB, metal core PCB, or any other type of printed circuit board.

It is understood that LED components according to the present disclosure can be fabricated using a method that incorporates submount panel or wafer comprising a plurality of submounts. Each of the submounts 64 can be formed with its own array of LEDs and globed optical elements such that multiple LED chips 62 can be formed across the submount panel as discussed below. Multiple LED chips 62 can then be singulated from the submount panel. Each submount 64 may also comprise a more complex combination of elements such as a plurality of "submount" assemblies which are mounted on a planar surface of submount. The submount assemblies can have different functionalities such as providing electrostatic discharge (ESD) protection for the various LED chips.

The size of the submount 64 in LED package 60 can vary depending on certain factors such as the size and number of LEDs. It is understood that the submount 64 can have essentially any shape, such as circular, oval, rectangular, hexagonal, or other multiple sided shapes.

In another embodiment, single LED element luminary packages can also be provided. The LED device can be configured as a flip chip LED package.

Example 1

Figure 9:
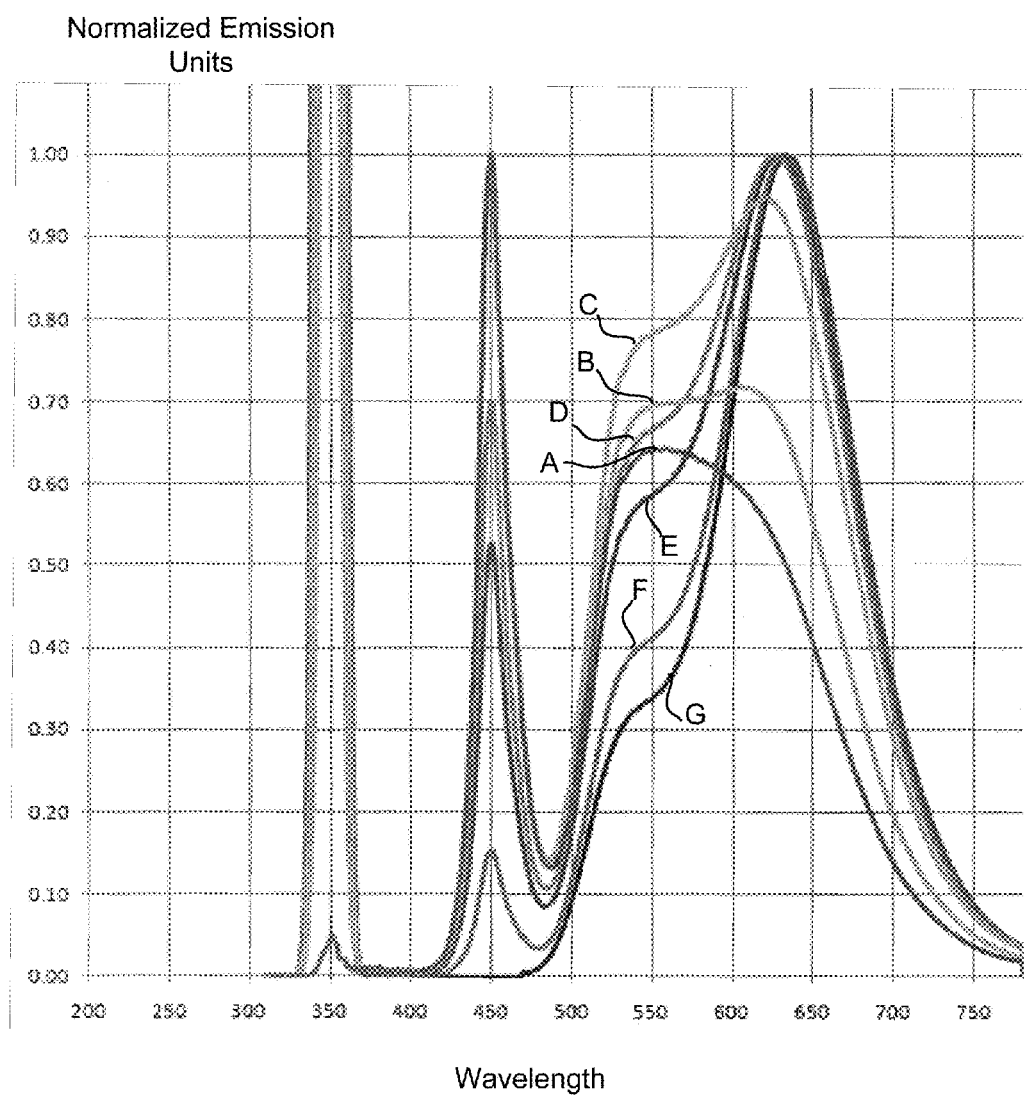
FIG. 9 shows graphically the optical properties of a lighting device operated in accordance with an embodiment of the present disclosure.

A test lighting device was constructed comprising blue LEDs of 450 nm and NUV LEDs of 350 nm having yellow/green (YAG:CE) and red (Nitride or BOSE) phosphors mixed to achieve at least a CCT of 4500K. Upon powering both LEDs of the lighting device, the blue LED excited the red and green phosphors similarly, whereas the greenish phosphor was excited to a lesser extent then the red by the NUV LED. When power distribution was adjusted such that the phosphors were excited by the blue LED alone, the CCT displayed proportionally less red spectral content (higher CCT). When power distribution was adjusted such that this same phosphor mix was excited by a mixture of the blue and NUV, or the NUV alone, the resultant CCT was lower. The results are summarized in Table 1 and correspond to representations of FIG. 9.

TABLE 1

CCT and CRI of lighting device of Example 1 with variable power distribution to the blue and NUV LED's, respectively.

| | CCT | du'y' | x | y | Excitation mW Blue % | UV % | CRI |
|---|---|---|---|---|---|---|---|
| A | 4490 | 0.0011 | 0.3615 | 0.3658 | 100% | 0% | 81 |
| B | 4000 | 0.0022 | 0.3793 | 0.3727 | 60% | 40% | 84 |
| C | 3500 | 0.0048 | 0.4018 | 0.3813 | 37% | 63% | 87 |
| D | 3000 | 0.0058 | 0.4314 | 0.3926 | 21% | 79% | 91 |
| E | 2750 | 0.0047 | 0.4506 | 0.4000 | 15% | 85% | 92 |
| F | 2200 | 0.0038 | 0.5112 | 0.4233 | 4% | 96% | 95 |
| G | 1966 | 0.0119 | 0.5497 | 0.4380 | 0% | 100% | 89 |

Thus, the results demonstrate that by varying power to the plural LEDs, the resultant CCT is adjustable with little variation on CRI of the resultant lighting device. For example, CRI values of about 87 to about 90 are obtainable with CCT's between about 2000 K to about 3500 K. The data also demonstrates the ability of the instant method to provide a color change (e.g., white to yellow). Further, a section of the range of Table 1 also provides for an emulation of incandescent dimming (~3000K to 2200K) down to about 5% brightness.

It is understood that the LED chips in the arrays, including the globe optical element, as herein disclosed and described can be arranged as one or more multiple multi-chip LED lamps as described in U.S. Patent Publication No. 2007/0223219 entitled "Multi-Chip Light Emitting Device for Providing High-CRI Warm White Light and Light Fixtures Including the Same", the disclosure of which is incorporated by reference.

The lighting sources and devices presently disclosed are generally applicable to a variety of existing lighting packages, for example, XLamp products XM-L, ML-B, ML-E, MP-L EasyWhite, MX-3, MX-6, XP-G, XP-E, XP-C, MC-E, XR-E, XR-C, and XR LED packages manufactured by Cree, Inc. The benefits in luminous flux and "emotional illumination" can be applied to many lighting applications, for example, commercial/retail display spotlights, LED retrofit bulbs, and other indoor and outdoor general-illumination applications.

The above has been described both generically and with regard to specific embodiments. Although the present disclosure has been set forth in what is believed to be the preferred embodiments, a wide variety of alternatives known to those of skill in the art can be selected within the generic disclosure. Other advantages and obvious modifications of the present disclosure will be apparent to the artisan from the above description and further through practice of the present disclosure.

I claim:

1. A lighting device comprising:
    plural excitation sources configured to provide at least two excitation peak emissions of different wavelength;
    at least one phosphor material radiationally coupled to the plural excitation sources and differently excited by the at least two excitation peak emissions of different wavelength; and at least two operational states comprising:
    a first operational state wherein emission by the at least one phosphor material upon excitation by the plural excitation sources contributes to a first correlated color temperature (CCT) value for the lighting device; and
    at least one additional operational state wherein the at least two peak emissions of different wavelengths are altered from that of the first operation state and emission by the at least one phosphor material upon excitation by the altered plural excitation sources contributes to at least one additional CCT value for the lighting device, wherein the at least one additional CCT value is different from the first CCT value;
    wherein the color rendering index (CRI) values of both the first and the second operational states are at least 81 for CCT values of between 2200 to 4500.

2. The lighting device of claim 1, wherein the at least one phosphor material includes two or more phosphor materials.

3. The lighting device of claim 1, wherein the at least one additional CCT value has different x, y color coordinates, as corresponding to a 1931 CIE chromaticity diagram, compared to the first CCT value.

4. The lighting device of claim 1, wherein the at least one phosphor material has a different relative amount of emission corresponding to each of the at least two peak emissions, and the relative amounts of emission radiation have essentially the same x, y color coordinates as corresponding to a 1931 CIE chromaticity diagram.

5. The lighting device of claim 1, further comprising electrical circuitry configured to selectively control electrical power distribution to the plural excitation sources.

6. The lighting device of claim 1, wherein the electrical power distribution is automatically controlled by an electrical circuit comprising one or more of a timer, motion detector, temperature detector, light detector, humidity detector, and sound detector.

7. The lighting device of claim 1, wherein the electrical power distribution is manually controlled.

8. The lighting device of claim 1, wherein the electrical power distribution is manually controlled by a separate electrical circuit comprising a dimmer switch.

9. The lighting device of claim 1, wherein the difference between the first CCT value and the at least one additional CCT value is greater than 50K.

10. The lighting device of claim 1, wherein the at least one phosphor material is combined in an optically transparent media.

11. The lighting device of claim 1, wherein the at least one phosphor material is deposited on the plural excitation sources.

12. The lighting device of claim 1, wherein the at least one phosphor material is spatially separated from the plural excitation sources.

13. The lighting device of claim 1, wherein the at least two peak emissions correspond, independently, to UV light and to blue light.

14. The lighting device of claim 1, wherein the at least one phosphor material provides a different relative amount of emission from the at least two excitation peak emissions of the plural excitation sources.

15. The lighting device of claim 1, wherein in the first operation state, emission of the at least one phosphor material of the first operation state is caused by at least one of the excitation peak emissions wavelengths; and in the at least one additional operational state, emission of the at least one phosphor material is caused by at least a different excitation peak emission wavelength.

16. The lighting device of claim 1, wherein in the first operation state, emission of the at least one phosphor material of the first operation state is caused by at least one of the excitation peak emissions wavelengths; and in the at least one additional operational state, emission of the at least one phosphor material is caused by at least the same excitation peak emission wavelength of more or less intensity.

17. The lighting device of claim 1, wherein the at least one phosphor material provides a different relative amount of emission corresponding to UV light excitation as compared to blue light excitation.

18. The lighting device of claim 1, wherein the at least one phosphor material comprises red phosphor, green phosphor, and yellow phosphor.

19. The lighting device of claim 18, wherein in the first operation state, emission of at least one of the red phosphor, the green phosphor, and the yellow phosphor is caused by a UV light excitation source, and wherein in the at least one additional operational state, emission of the at least one of the red phosphor, the green phosphor, and the yellow phosphor is excited by a blue light excitation source.

20. The lighting device of claim 1, wherein the plural excitation sources are selected from UV-, blue-, green-, yellow-, and red-emitting LEDs.

21. The lighting device of claim 1, wherein the plural excitation sources comprise at least one UV light emitting LED and at least one blue light emitting LED.

22. The lighting device of claim 1, further comprising one or more filters to reduce or eliminate IR- and UV-light release from the lighting device.

23. A lighting device comprising:
plural spaced-apart LEDs configured to provide at least two excitation peak emissions of different wavelength,
electrical circuitry configured to selectively control electrical power distribution to the plural spaced-apart LEDs;
at least one phosphor material radiationally coupled to the plural spaced-apart LEDs and differently excited by the at least two excitation peak emissions of different wavelength; and at least two operational states comprising:
a first operational state wherein emission by the at least one phosphor material upon excitation by at least one of the at least two excitation peak emissions contributes to a first correlated color temperature (CCT) value for the lighting device; and
at least one additional operational state wherein at least one of the at least two peak emissions of different wavelengths is altered from that of the first operation state and emission by the at least one phosphor material upon excitation by at least one of the altered excitation peak emissions contributes to at least one additional CCT value for the lighting device, wherein the at least one additional CCT value is different from the first CCT value;
wherein the color rendering index (CRI) values of both the first and the second operational states are at least 81 for CCT values of between 2200 to 4500.

24. The lighting device of claim 23, wherein the at least one phosphor material includes two or more phosphor materials.

25. The lighting device of claim 23, wherein the plural spaced apart LEDs comprise at least one UV light emitting LED providing at least one of the at least two excitation peak emissions, and at least one blue light emitting LED providing at least one of the at least two excitation peak emissions.

26. The lighting device of claim 23, wherein the plural spaced apart LEDs comprise at least one UV light emitting LED, and at least one blue light emitting LED, wherein the at least one phosphor material provides a different relative amount of emission corresponding to UV light excitation as compared to blue light excitation.

27. The lighting device of claim 26, wherein in the first operation state emission of at least one of the red phosphor, the green phosphor, and the yellow phosphor is caused by a UV light emitting LED, and wherein in the at least one additional operational state, emission of the at least one of the red phosphor, the green phosphor, and the yellow phosphor is excited by a blue LED light.

28. The lighting device of claim 23, wherein the at least one phosphor material comprises red phosphor, green phosphor, and yellow phosphor.

29. The lighting device of claim 23, wherein the at least one phosphor material is combined in an optically transparent media.

30. The lighting device of claim 23, wherein at least one phosphor material is deposited on the plural spaced-apart LEDs and at least one of the phosphor material is spatially separated from the plural spaced-apart LEDs.

31. The lighting device of claim 23, further comprising one or more filters to reduce or eliminate IR- and UV-light release from the lighting device.

32. A method of varying the correlated color temperature (CCT) value of a lighting apparatus, the method comprising the steps of
providing a lighting device, the lighting device comprising:
plural excitation sources providing at least two peak emissions of different wavelengths;
at least one phosphor material radiationally coupled to the plural excitation sources and differently excited by the at least two excitation peak emissions of different wavelength; and at least two operational states, the operational states comprising:

a first operational state wherein emission by the at least one phosphor material upon excitation by the plural excitation sources contributes to a first correlated color temperature (CCT) value for the lighting device; and at least one additional operational state wherein the at least two peak emissions of different wavelengths are altered from that of the first operation state and emission by the at least one phosphor material upon excitation by the altered plural excitation sources contributes to at least one additional CCT value for the lighting device, wherein the at least one additional CCT value is different from the first CCT value;

adjusting the relative amount of the at least two peak emissions of different wavelength;

wherein the color rendering index (CRI) values of both the first and the second operational states are at least 81 for CCT values of between 2200 to 4500.

33. The method of claim 32, further comprising providing electrical circuitry configured to control electrical power distribution to the plural excitation sources.

34. The method of claim 32, wherein the at least one phosphor material includes two or more phosphor materials.

35. The method of claim 32, wherein the at least one additional CCT value has different x, y color coordinates, as corresponding to a 1931 CIE chromaticity diagram, compared to the first CCT value.

36. The method of claim 32, wherein the electrical power distribution is automatically adjustable by a electrical circuit comprising one or more of a timer, motion detector, temperature detector, light detector, and sound detector.

37. The method of claim 32, wherein the electrical power distribution is manually adjustable.

38. The method of claim 32, wherein the difference between the first CCT value and the at least one additional CCT value is greater than 50K.

39. The method of claim 32, wherein the at least two peak emissions correspond, independently, to UV light and to blue light.

40. The method of claim 32, wherein in the first operation state, emission of the at least one phosphor material of the first operation state is caused by at least one of the excitation peak emissions wavelengths; and in the at least one additional operational state, emission of the at least one phosphor material is caused by at least a different excitation peak emission wavelength.

41. The method of claim 32, wherein in the first operation state, emission of the at least one phosphor material of the first operation state is caused by at least one of the excitation peak emissions wavelengths; and in the at least one additional operational state, emission of the at least one phosphor material is caused by at least the same excitation peak emission wavelength of more or less intensity.

42. The method of claim 32, wherein the at least one phosphor material is red phosphor, green phosphor, and yellow phosphor.

43. The method of claim 42, wherein in the first operation state emission of at least one of the red phosphor, the green phosphor, and the yellow phosphor is caused by a UV light emitting LED contributing to the first correlated color temperature (CCT) value, and wherein in the at least one additional operational state, emission of the at least one of the red phosphor, the green phosphor, and the yellow phosphor is excited by a blue LED light source contributing to the second correlated color temperature (CCT) value.

44. The method of claim 32, wherein the at least one phosphor material is spatially separated from the plural light source.

45. The method of claim 32, wherein the at least one phosphor material is deposited on the plural light source.

46. The method of claim 32, wherein the plural light source comprises LEDs.

47. The method of claim 32, wherein the at least one phosphor material is deposited on the LEDs and the least one of the phosphor material is spatially separated from the plural spaced-apart LEDs.

48. The method of claim 32, wherein the lighting device further comprising one or more filters to reduce or eliminate IR- and UV-light release from the lighting device.

* * * * *